United States Patent
Jakob et al.

(10) Patent No.: US 6,222,732 B1
(45) Date of Patent: *Apr. 24, 2001

(54) ELECTRICAL DEVICE, IN PARTICULAR A SWITCHING AND CONTROL UNIT FOR MOTOR VEHICLES

(75) Inventors: Gert Jakob, Stuttgart; Joachim Zimmermann, Schwieberdingen; Friedrich Horn, Lichtenau; Hans Rummel, Ansbach; Thomas Sutter, Oberriexingen; Dieter Karr, Tiefenbronn; Karl Schupp, Pforzheim; Dieter Neuhaus, Sulzbach; Dieter Hussmann, Steinheim; Peter Jares, Sindelfingen, all of (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/064,010
(22) PCT Filed: Sep. 9, 1992
(86) PCT No.: PCT/DE92/00721
  § 371 Date: May 14, 1993
  § 102(e) Date: May 14, 1993
(87) PCT Pub. No.: WO93/06705
  PCT Pub. Date: Apr. 1, 1993

(30) Foreign Application Priority Data

Sep. 21, 1991 (DE) .................................................. 41 31 515
Jul. 11, 1992 (DE) .................................................. 42 22 838

(51) Int. Cl.⁷ ...................................................... H05K 7/20
(52) U.S. Cl. .......................... 361/704; 174/252; 361/715; 361/720
(58) Field of Search .................................. 165/80.3, 185; 174/16.3, 252, 35 R, 51; 361/690, 704, 705, 707–722, 753, 799–800

(56) References Cited

U.S. PATENT DOCUMENTS 3,061,760 * 10/1962 Ezzo ..................................... 361/708
3,631,325 12/1971 Wenz .

(List continued on next page.)

FOREIGN PATENT DOCUMENTS

| 2 214 163 | 10/1973 | (DE) . |
| 2 226 395 | 12/1973 | (DE) . |
| 31 15 017 A1 | 11/1982 | (DE) . |
| 81 14 325 | 11/1982 | (DE) . |
| 33 05 167 A1 | 8/1984 | (DE) . |
| 34 37 774 A1 | 4/1986 | (DE) . |
| 38 32 856 A1 | 3/1990 | (DE) . |
| 2223933 | 10/1974 | (FR) . |

OTHER PUBLICATIONS

"Heat Sink Assembly For Tab–Mounted Devices", IBM Tech. Disclosure Bulletin, vol. 31, No. 6, Nov. 1988, pp. 372–373, (361/720).*

Primary Examiner—Gregory Thompson
(74) Attorney, Agent, or Firm—Michael J. Striker

(57) ABSTRACT

The electrical unit has a printed circuit board (10) supporting the circuit, which includes a power component (11) which generates heat. In order to dissipate this heat from the power component, the power component rests on a heat conductive layer (13) which in turn is applied to the upper side (12) of the printed circuit board. This heat conductive layer further has a portion of the lid (18, 19) of the housing resting on it, which serves as a cooling area. Alternatively, the cooling area can be a free-standing cooling element. The heat transfer thus takes place via the heat conductive layer (13) to the cooling element (18, 19) so that the latter may be applied and formed independently of type and form of the power component.

14 Claims, 4 Drawing Sheets

U.S. PATENT DOCUMENTS

| | | |
|---|---|---|
| 3,885,304 | 5/1975 | Kaiser et al. . |
| 3,919,602 | 11/1975 | Kaiser et al. . |
| 4,204,247 * | 5/1980 | Wigley ................................ 174/16.3 |
| 4,339,260 | 7/1982 | Johnson et al. . |
| 4,475,445 | 10/1984 | Heil et al. . |
| 4,811,165 | 3/1989 | Currier et al. . |
| 4,823,235 * | 4/1989 | Suzutii et al. ....................... 361/818 |
| 4,941,067 * | 7/1990 | Craft ................................... 174/16.3 |
| 4,945,451 * | 7/1990 | Cohl et al. .......................... 174/16.3 |
| 5,019,941 * | 5/1991 | Craft ................................... 174/16.3 |
| 5,191,512 * | 3/1993 | Ogura et al. ......................... 361/720 |

\* cited by examiner

ELECTRICAL DEVICE, IN PARTICULAR A SWITCHING AND CONTROL UNIT FOR MOTOR VEHICLES

BACKGROUND OF THE INVENTION

The invention relates to an electrical device having a printed circuit board carrying an electronic circuit and at least one power component to be cooled, particularly a switching or control unit for a motor vehicle. In these known devices, power components which heat up intensely are mounted on cooling elements which are fixed on a printed circuit board or on a housing on which the printed circuit board is secured. These cooling elements consist of special cooling profiles by which the power components are spaced from the printed circuit board or project from it. These cooling elements have the disadvantage that they consist of profiles having a complicated structure, and that the process of assembling the device with the profiles can be automated only with great difficulty. Due to the design of the cooling elements and the associated method of mounting the power components, these electrical devices have to be comparatively large, thus taking up a considerable amount of installation space.

In U.S. Pat. No. 4,811,165, an electrical device is described in which the electronic components are arranged on a printed circuit board which carries an electronic circuit. This is made from a flexible material and located on a plate of good thermal conductivity. This has the disadvantage that heat from the electronic components must be dissipated through the printed circuit board to the heat conductive plate. In addition, the (conventional) method of attaching electronic components in a wired structure can be achieved only with considerable effort, since additional insulating provisions vis-à-vis the heat conductive plate are required when the connecting wires or connection electrodes are routed through soldering apertures of the printed circuit board.

SUMMARY OF THE INVENTION

According to the invention, the electrical device comprises a printed circuit board carrying an electronic circuit and at least one power component to be cooled; a heat conductive layer applied to the printed circuit board at least in the vicinity of the at least one power component, each of the power components resting flat with their largest face in contact with the heat conductive layer; and a free-standing metallic body connected to the heat conductive layer and spaced from the power components to act as a cooling element for dissipation of heat conducted to the free-standing metallic body through the heat conductive layer from the power components.

Alternatively, instead of a free-standing metallic body the cooling element can be a part of a housing accommodating the printed circuit board. In a preferred embodiment spring means can be provided which presses the printed circuit board against an interior part of the housing to establish a good heat conduction between the heat conductive layer on the circuit board and the housing.

The heat conductive layer can advantageously be a metal cladding, a conductor track or a laminate of the circuit board. It can advantageously provide a screening for improvement of electromagnetic compatibility.

In contrast, the electrical device in accordance with the invention has the advantage that a particularly flat form of the electrical device is made possible by the arrangement of the power components. The type and form of the power components has no effect on the form and shape of the cooling elements, so that their type and method of attachment can be determined by other factors. The attachment of the power components in accordance with the invention facilitates good heat dissipation which allows a larger number of power components to be located on the printed circuit board. Good heat dissipation further allows a higher ambient temperature, such as prevails in motor vehicles, for example. The housing of the electrical device can further be automatically equipped and soldered in a small number of production steps.

BRIEF DESCRIPTION OF THE DRAWINGS

Two embodiment examples of the invention are explained in more detail in the description which follows and in the drawings.

DESCRIPTION OF THE PREFERRED EMBODIMENTS

Figure 1:
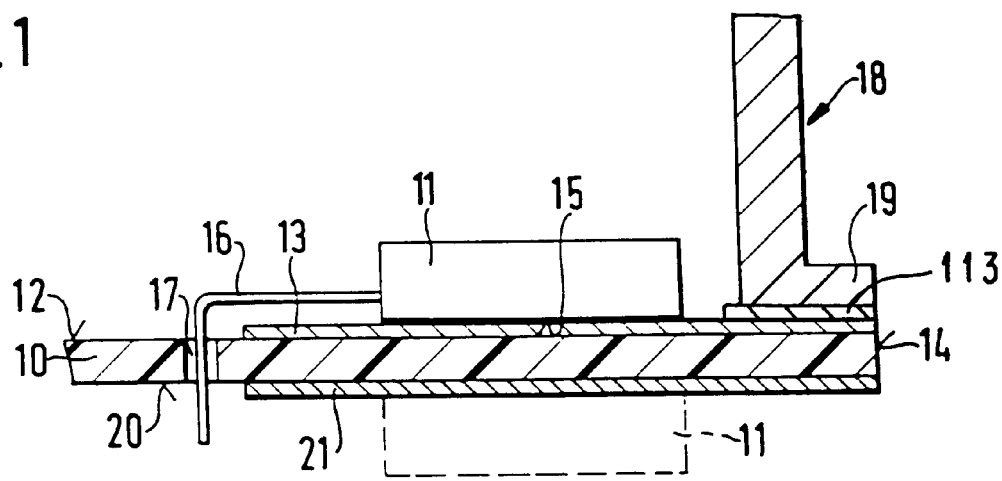
FIG. 1 is a longitudinal cross-section cutaway view through a first embodiment of a control unit according to the invention.
Figure 2:
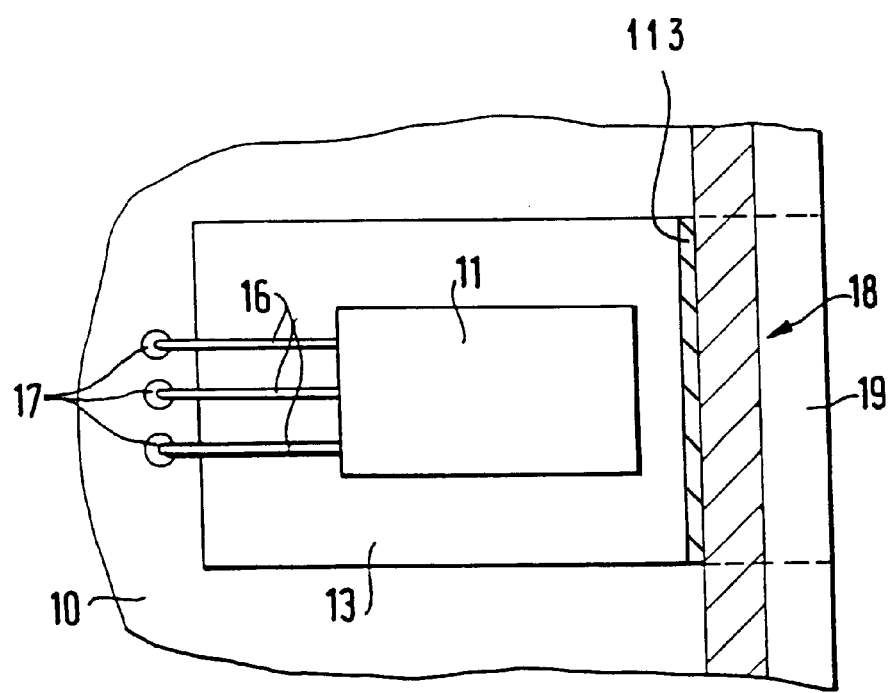
FIG. 2 is a top view of a printed circuit board of the control unit of FIG. 1.

In FIGS. 1 and 2, the number 10 denotes the printed circuit board of an electronic control unit which carries a circuit which is not shown in any detail. This circuit includes a power component 11 which heats up during operation and from which the heat must be dissipated.

The upper side 12 of the printed circuit board 10 has a layer 13 of material with good thermal conductivity applied to it which extends to the edge 14 of the printed circuit board. The layer 13 of heat conductive material is preferably metallic and may be an appropriately designed conductor track, for example, or a screening surface for the improvement of the electromagnetic compatibility (EMC), a laminate, a copper cladding, or similar.

This heat conductive layer 13 has the power component 11 mounted to it by its rear face 15 (largest face), and it is affixed in some suitable manner, for example by gluing, soldering, or screw fixing. The attached rear face 15 of the power component 11 is smaller than the base area of the heat conductive layer 13.

The connection electrodes 16 of the power component 11 extend initially parallel to the printed circuit board 10 without touching the heat conductive layer 13, and they are bent clear of the conductive layer and guided into corresponding soldering apertures 17 of the printed circuit board. The power component is connected to the circuit by soldering.

The printed circuit board 10 has on its upper side 12 a hood-shaped cover 18, preferably a free-standing metallic body, the peripheral flange 19 of which sits on the circuit board at the edge of the circuit board 10 and thus also on the heat conductive layer 13. The cover 18 or its flange 19 is connected to the printed circuit board 10 in a suitable manner, for example by gluing, screw fixing, or soldering.

The cover 18 is constructed, at least in the region of the heat conductive layer 13, from a heat conductive material, preferably a metal, and it serves as a cooling surface for the power component 11.

The heat to be dissipated from the power component 11 is thus passed via the heat conductive layer 13 directly of to a cooling surface, the cover 18. There is thus no elaborate mounting of the power component on or to a specifically form adapted cooling surface. The cooling surface is therefore independent of the form of the power component, which means that the form of the power component does not influence either the form or the position of the cooling surface. Furthermore, the power component and the cooling surface do not have to be in close proximity to each other.

If the printed circuit board 10—as shown as hatched in FIG. 1—is designed as a two-layer circuit board, the underside 20 can also be correspondingly equipped with power components 11. These then also rest on a heat conductive layer 21, via which the dissipated heat is passed to a cooling surface, which is not shown.

To improve the heat transfer between the heat conductive layer 13 or 21 and the cooling surface, it is possible to structure the surface of the heat conductive layer appropriately. Using suitable methods, it is possible to emboss a soldered layer or some other heat conductive layer in lattice structure, by a reflow soldering process, for example.

A large contact area between the heat conductive layer 13 and the cooling surface is of further advantage for improved heat transfer.

Where several power components 11 are arranged adjacent to each other on one side 12 or 20 of the printed circuit board, the metallic layers 13 or 21 involved should be insulated from each other, i.e. they should not contact each other.

If the cooling surface, as shown in the embodiment example, is on the cover of a housing or a freely accessible—not shown—cooling element (e.g. cooling angle), then to good advantage it is electrically insulated from the heat conductive layer 13. To this end, the cooling surface may be provided with an insulating layer, an anodized oxide layer, varnish or similar, in the area of contact. The relevant cooling element can then additionally be used for the cooling of several power components.

It is further possible to provide the heat conductive layer 13, at least in the region of the cooling surface, with an insulating layer.

In contrast to this method, it may for example, be expedient in certain applications for the improvement of the electromagnetic compatibility, to have an electrically conductive connection between the cooling surface and the heat conductive layer 13. These are then assembled without any insulation.

If, for example, a conductor track of appropriate width or a screening surface is used as a heat conductive layer, this can be constructed thicker (increased layer thickness) in order to improve the heat conductivity.

In the wiring area of the printed circuit board, a conductive layer with a thickness of, say, 30 µm is applied. This allows conductive tracks for electrical contact with the components on the circuit board with widths below 200 µm and with similar distances between the conductive tracks to be produced.

In the areas in which electrical components are to be connected heat conductively to the conductor tracks, the layer thickness of the conductor track acting as the heat conducting layer 13 should be increased to thicknesses above 50 µm, preferably to layer thicknesses of from 100 µm to 200 µm.

To improve the heat conductivity further, the printed circuit board 10 can be provided with heat conductive layers on both sides (side 12 or side 20), which are connected to each other by a generally known through-contact method. In this way, parallel heat dissipating paths are created.

If the printed circuit board 10 is fitted with SMD components (SMD=surface mounted device) in the area of the heat conductive layer, then the surface of the heat conductive layer 13 and that of the corresponding conductor track section are preferably arranged in one plane, for good mounting and contact.

If the cooling surface, as shown in the embodiment example, is on the cover of a housing, this can be designed so that an electromagnetic screening of the covered circuit is effected at the same time (improvement of electromagnetic compatibility, EMC). This cover is then constructed as a metallic or metallized box which covers the appropriate printed circuit board areas. This metallic box can then cover the entire area of the printed circuit board and rests on the edges of the printed circuit board, where electrical and heat conductive contact is made. Alternatively, it is possible to design the box so that it covers the printed circuit board only in that region in which sensitive components are arranged, i.e. components which need to be screened with regard to the electromagnetic compatibility of the circuit. The power components which require cooling can be arranged within or outside the box.

In order to connect this box to the printed circuit board in a mechanically stable manner and with good conductive capabilities, connecting tabs can be fitted to its underside, which project through corresponding apertures of the printed circuit board or which are guided past their edges. After soldering the top side of the printed circuit board, the box is placed on it, and the connecting tabs are bent over and soldered. These connecting tabs can also be used to fix a corresponding bottom part (also an EMC box).

Figure 3:
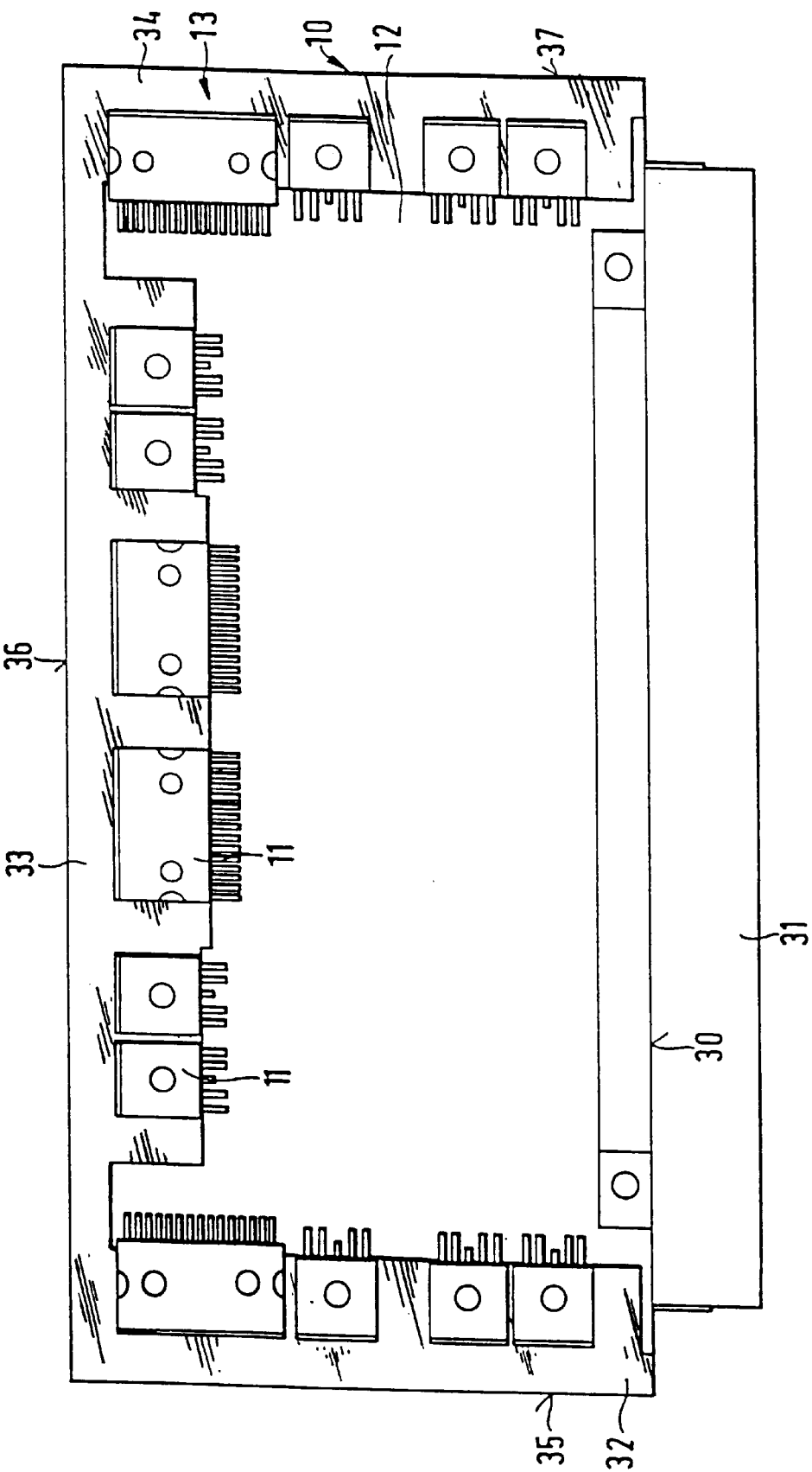
FIG. 3 is a top view of a printed circuit board in a second embodiment example of the control unit according to the invention.
Figure 4:
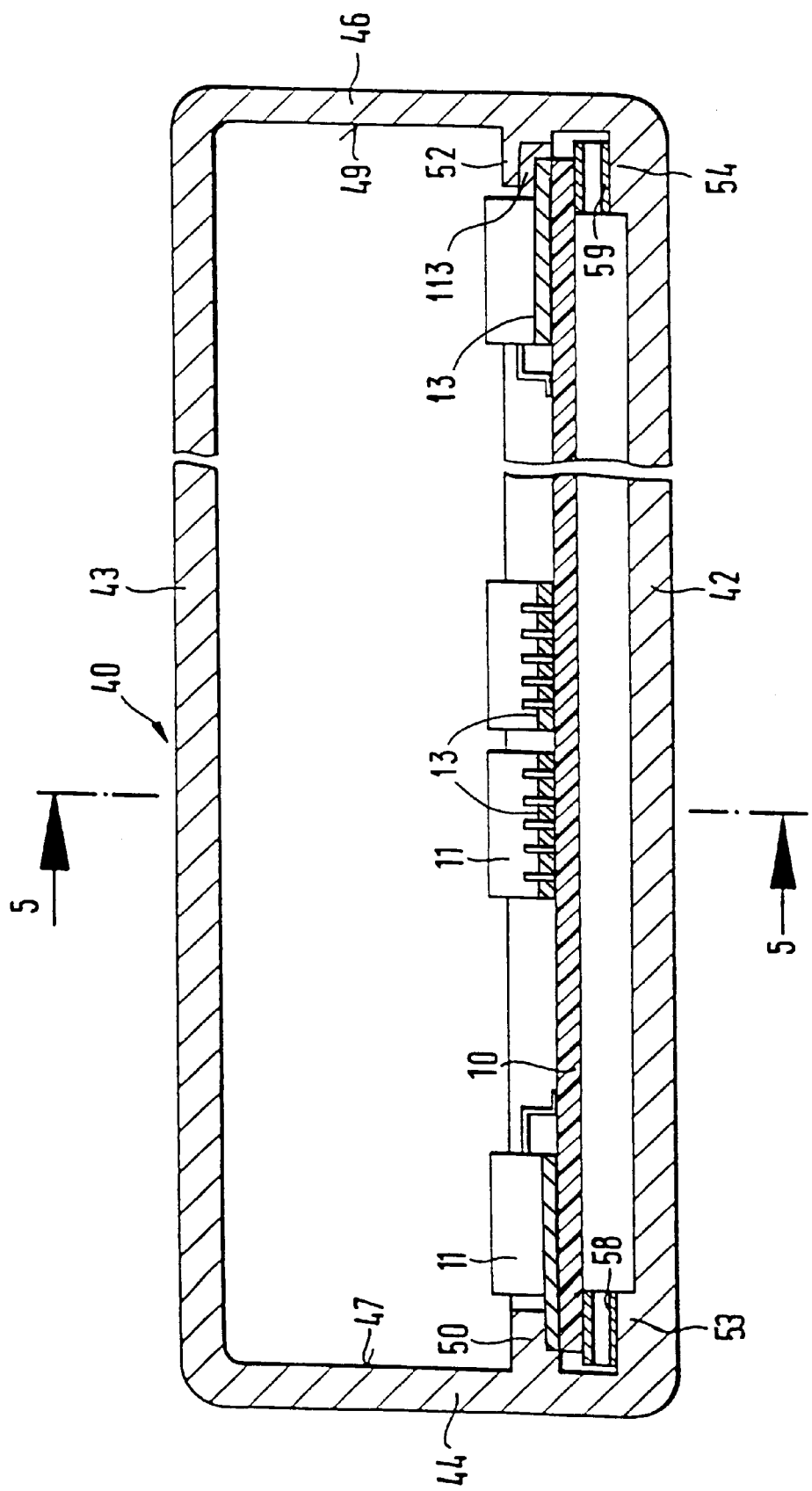
FIG. 4 is a cross-sectional view of the control unit shown in FIG. 3 taken along the section lines 4—4 in FIG. 5.
Figure 5:
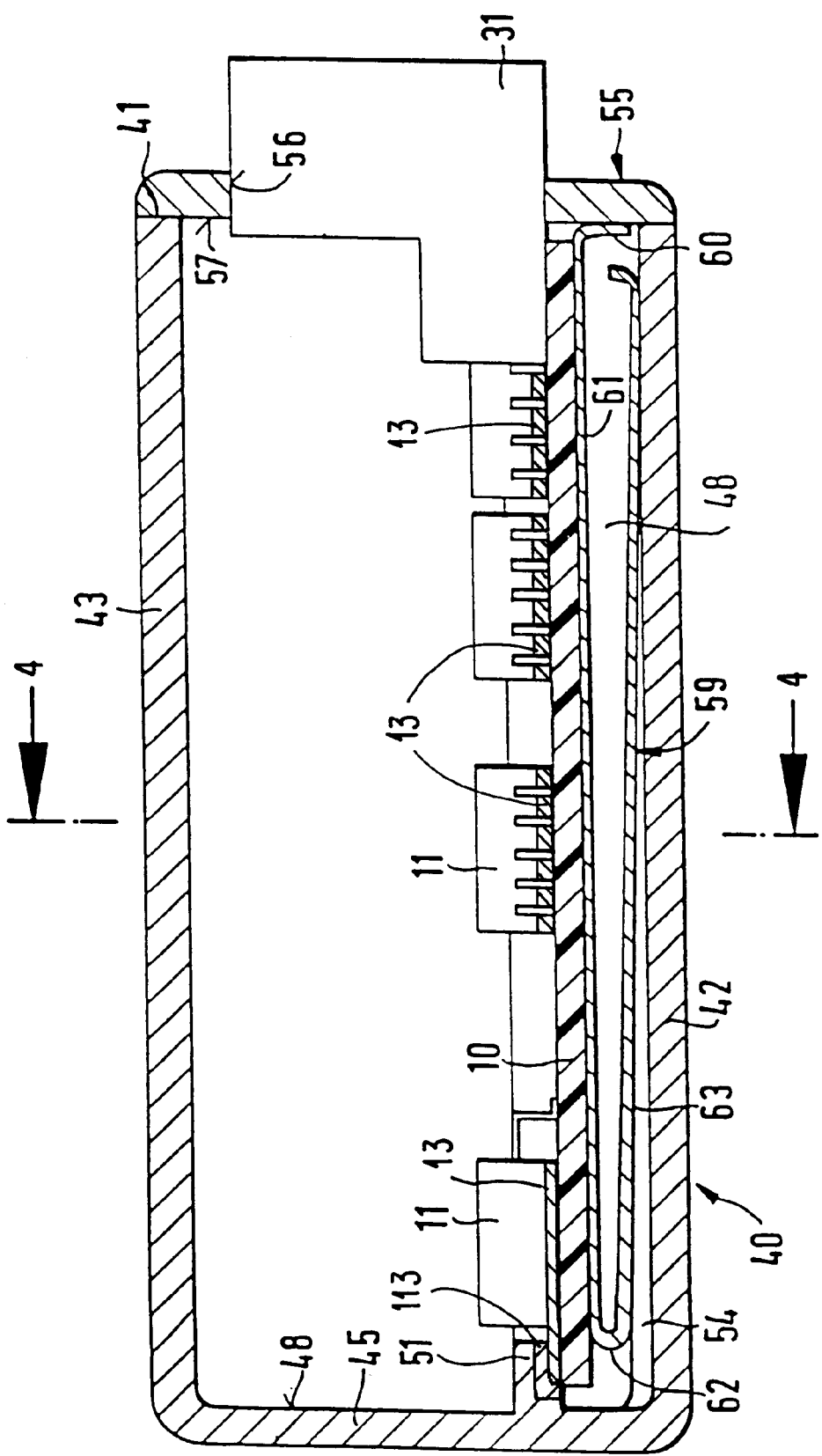
FIG. 5 is a cross-sectional view of the control unit shown in FIG. 3 taken along the section lines 5—5 in FIG. 4.

In the second embodiment example of the electronic control device shown in FIGS. 3 to 5, a connection between the heat conductive layer and the cooling element is made in a particularly advantageous manner which is easily and securely effected during assembly. The cooling element in this embodiment example is the housing 40 of the control device. Components which are identical to those in the previously described embodiment example are designated with the same reference numbers.

The printed circuit board 10 is of rectangular design and carries on its front face 30 a plug strip 31 for contacting the electronic circuit. The upper side 12 of the printed circuit board 10 has the layer 13 of material with good thermal conductivity applied to it. This layer 13 is arranged on the edge regions 32 to 34 in the form of a copper cladding. The layer thickness of this copper cladding or deposit of copper is preferably between 300 µm and 400 µm. In the embodiment example shown here, the heat conductive layer 13 is extended to form a continuous surface on the three free front faces 35 to 37 of the printed circuit board. The width of the heat conductive layer 13 (at right angles to the outer edge of the printed circuit board) is dependent on the power components 11 to be cooled or the dimensions of these.

The power components to be cooled (wiring components or SMD=surface mounted devices) are placed on this heat conductive layer 13 such that they are at a certain distance from the front face or from the edge of the printed circuit board.

The width of the heat conductive layer 13 is matched to the particular structural shape of the power components, in sections, so that the areas which are in contact are as large as possible in order to achieve good heat transfer, yet still allowing reliable contacting of the particular power component.

The housing 40 for the printed circuit board 10 is approximately rectangular and is parallelepiped shaped open on one front face 41. It is therefore composed of one base part 42, one lid part 43, and three side walls 44, 45 and to 46. On each of the inner sides 47, 48 and 49, a flange 50, 51 and 52 is formed which extends parallel to the base part 42. The flanges 50 and 51, 51 and 52, respectively, are continuously connected with each other.

On the base part 42, a wedge 53, 54 is formed at the transition to the side walls 44 and 46, respectively, which extends rising from the open front face 41 to the opposite side wall 45.

The housing 40 is closed on its front face 41 by a front plate 55. This has an aperture 56, through which the plug strip 31 projects. On the inner side 57 of the front plate 55, two wedge shaped spring elements 58, 59 are provided. The two spring elements 58, 59 are of the same structure, each has a short fixing section 60, which attaches to the inner side 57 of the front plate 55 and is fixed there. Projecting from this at an approximately right angle is an upper section 61, the length of which is slightly shorter than that of the flanges 50 and 52. The upper section 61 merges into a connecting arc 62, from which a lower section 63 extends. This projects as far as the vicinity of the fixing section 60. The upper section 61 and the lower section 63 form a wedge, which tapers, starting from the front plate 55.

In the assembled condition of the control unit, the printed circuit board 10 is between the flanges 50, 51 and 52 and the base part 42 of the housing. The front plate 55 closes the housing 40, with the plug strip 31 protruding through the aperture 56. The spring element 58 rests on the wedge 53, while the second spring element 59 rests on the wedge 54. In their spring action and shape, the spring elements 58 and 59 are adapted to the wedges 53 and 54 and their distance to the flanges 50 and 52 so that the printed circuit board is pressed with its upper side against the flanges, causing the heat conductive layer 13 and the underside of the flanges to press against each other. The heat transfer from the power components 11 can thus take place via the heat conductive layer 13 to the flanges 50 to 52 and consequently to the housing 40.

During assembly of the electrical device, the printed circuit board 10 with the plug strip 31 is inserted into the housing 40 together with the front plate 55. The printed circuit board 10 is then between the flanges 50 and 52 and the base part 42 of the housing. During insertion, the spring elements 58 and 59 rest on the wedges 53 and 54, respectively. After insertion, each of the wedge shaped spring elements exerts an adequate contact pressure by action of the wedges 53 and 54, which is required for the heat dissipation. The heat is thus dissipated from the power components via the heat conductive layer to the housing, without any additional cooling body or support frame. Nevertheless, even greater heat outputs can be transferred.

What is claimed is:

1. An electrical device comprising:
    a printed circuit board (10) carrying an electronic circuit and having a plurality of electrically conducting conductor tracks and a metal cladding as heat conductive layer (13) for heat conduction, said heat conductive layer (13) also serving as an electrically conducting element and being arranged in an edge region (32 to 34) of said printed circuit board (10);
    at least one power component (11) to be cooled, said at least one power component (11) being electrically connected with at least one of said electrically conducting conductor tracks, being arranged in said edge region (32 to 34) and resting on said heat conductive layer (13) in said edge region (32 to 34) so that heat generated in said at least one power component (11) is conducted away by said heat conductive layer (13); and
    a cooling element for dissipation of the heat conducted from said at least one power component (11) by said heat conductive layer (13) to said cooling element;
    wherein said heat conductive layer (13) in said edge region (32 to 34) has a thickness greater than a thickness of said conductor tracks in another region of said printed circuit board outside of said edge region (32 to 34).

2. The electrical device as defined in claim 1, wherein said thickness of said heat conductive layer (13) in said edge region (32 to 34) is greater than 70 micrometers and said thickness of said conductor tracks is approximately 30 micrometers in said another region of said printed circuit board outside of said edge region (32 to 34).

3. The electrical device as defined in claim 1, wherein said at least one power component (11) has a largest surface (15) and contacts with said largest surface (15) said heat conductive layer (13).

4. The electrical device as defined in claim 1, wherein said heat conductive layer (13) provides a screening surface for improvement of electromagnetic compatibility.

5. The electrical device as defined in claim 1, wherein said heat conductive layer (13) is a laminate of said printed circuit board (10).

6. The electrical device as defined in claim 1, further comprising a housing (40) and wherein said cooling element is at least a part of said housing.

7. The electrical device as defined in claim 1, wherein said heat conductive layer (13) and said cooling element are electrically insulated from each other.

8. The electrical device as defined in claim 1, further comprising an electromagnetically shielded housing (40) including interiorly extending flanges (50 to 52) and wedge-shaped guiding elements (53,54) and wherein said cooling element is at least a part of the electromagnetically shielded housing.

9. The electrical device as defined in claim 8, wherein said at least one power component (11) is within said electromagnetically shielded housing (40).

10. The electrical device as defined in claim 8, further comprising spring means (58,59) arranged in said housing (40) to urge said heat conducting layer (13) and said flanges (50 to 52) of said housing (40) into contact with each other.

11. The electrical device as defined in claim 8, wherein said housing (40) is a push-on-module accessible from a front side (41) thereof.

12. The electrical device as defined in claim 10, wherein said spring means (58,59) are wedge-shaped and arranged on said wedge-shaped guiding elements (53,54) of the housing (40).

13. An electrical device comprising:
    an electromagnetically shielded housing (40) including interiorly extending flanges (50 to 52) and wedge-shaped guiding elements (53,54);
    a printed circuit board (10) carrying an electronic circuit and having a plurality of electrically conducting conductor tracks and a heat conductive layer (13) for heat conduction, said heat conductive layer (13) also serving as an electrically conducting element and being arranged in an edge region (32 to 34) of said printed circuit board (10) in contact with said flanges (50 to 52);

at least one power component (11) to be cooled, said at least one power component (11) being electrically connected with at least one of said electrically conducting conductor tracks, being arranged in said edge region (32 to 34) and resting on said heat conductive layer (13) in said edge region (32 to 34), so that heat generated in said at least one power component (11) is conducted to said heat conductive layer (13);

a cooling element for dissipation of the heat conducted from said at least one power component (11) by said heat conductive layer (13) to said cooling element, wherein said cooling element is at least a part of said housing (40); and spring means (58,59) arranged between said printed circuit board (10) and said wedge-shaped guiding elements (53,54) of said housing to urge said heat conducting layer (13) and said interiorly extending flanges (50 to 52) of said housing into contact with each other;

wherein said heat conductive layer (13) has a thickness greater than 70 micrometers in said edge region (32 to 34) of said printed circuit board and said conductor tracks have a thickness that is approximately 30 micrometers in another region of said printed circuit board, said another region of said printed circuit board being outside of said edge region (32 to 34) and not provided with said heat conductive layer (13).

14. The electrical device as defined in claim 1 or 13, consisting of a switching or control unit for a motor vehicle.

* * * * *